United States Patent
Chou et al.

(10) Patent No.: US 11,393,528 B2
(45) Date of Patent: Jul. 19, 2022

(54) RRAM CIRCUIT AND METHOD

(71) Applicant: TAIWAN SEMICONDUCTOR MANUFACTURING COMPANY, LTD., Hsinchu (TW)

(72) Inventors: Chung-Cheng Chou, Hsinchu (TW); Chien-An Lai, Hsinchu (TW); Hsu-Shun Chen, Hsinchu (TW); Zheng-Jun Lin, Hsinchu (TW); Pei-Ling Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/179,052

(22) Filed: Feb. 18, 2021

(65) Prior Publication Data

US 2021/0174871 A1    Jun. 10, 2021

Related U.S. Application Data

(63) Continuation of application No. 16/422,924, filed on May 24, 2019, now Pat. No. 10,930,344.

(60) Provisional application No. 62/679,679, filed on Jun. 1, 2018.

(51) Int. Cl.
    *G11C 13/00*    (2006.01)

(52) U.S. Cl.
    CPC ........ *G11C 13/0038* (2013.01); *G11C 13/003* (2013.01); *G11C 13/004* (2013.01); *G11C 13/0069* (2013.01)

(58) Field of Classification Search
    None
    See application file for complete search history.

(56) References Cited

U.S. PATENT DOCUMENTS

| | | | |
|---|---|---|---|
| 7,548,467 B2 | 6/2009 | Kim et al. | |
| 9,711,203 B2 | 7/2017 | Antonyan | |
| 10,115,350 B2 | 10/2018 | Kimura et al. | |

(Continued)

FOREIGN PATENT DOCUMENTS

| | | |
|---|---|---|
| CN | 101246734 | 8/2008 |
| CN | 101561994 | 10/2009 |

(Continued)

OTHER PUBLICATIONS

Office Action dated Apr. 9, 2020 from corresponding application No. TW 108118509. All pages.

(Continued)

*Primary Examiner* — James G Norman
(74) *Attorney, Agent, or Firm* — Hauptman Ham, LLP

(57) ABSTRACT

A memory circuit includes a bias voltage generator, a drive circuit, and a resistive random-access memory (RRAM) device. The bias voltage generator includes a first transistor configured to generate a voltage difference based on a first current and an activation voltage, and is configured to output the activation voltage and a bias voltage based on the voltage difference. The drive circuit is configured to receive the bias voltage and output a drive voltage having a voltage level based on the bias voltage, and the RRAM device is configured to receive the activation voltage and conduct a second current responsive to the drive voltage and the activation voltage.

20 Claims, 7 Drawing Sheets

(56) References Cited

U.S. PATENT DOCUMENTS

| | | | |
|---|---|---|---|
| 2010/0110768 A1* | 5/2010 | Choi | ........................ G11C 8/10 365/163 |
| 2013/0070534 A1 | 3/2013 | Carter et al. | |
| 2017/0110191 A1 | 4/2017 | Aitken et al. | |

FOREIGN PATENT DOCUMENTS

| | | |
|---|---|---|
| KR | 20100049926 | 5/2010 |
| TW | 201040963 | 11/2010 |

OTHER PUBLICATIONS

Office Action dated Nov. 4, 2020 for corresponding case No. CN 201910477228. (pp. 1-11).

\* cited by examiner

RRAM CIRCUIT AND METHOD

PRIORITY CLAIM

The present application is a continuation of U.S. application Ser. No. 16/422,924, filed May 24, 2019, which claims the priority of U.S. Provisional Application No. 62/679,679, filed Jun. 1, 2018, each of which is incorporated herein by reference in its entirety.

BACKGROUND

In some applications, integrated circuits (ICs) include memory circuits that store data in arrays of resistive random-access memory (RRAM) cells. An individual RRAM cell is programmable to a high resistance state (HRS) or a low resistance state (LRS), each state representing a logical state stored by the RRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
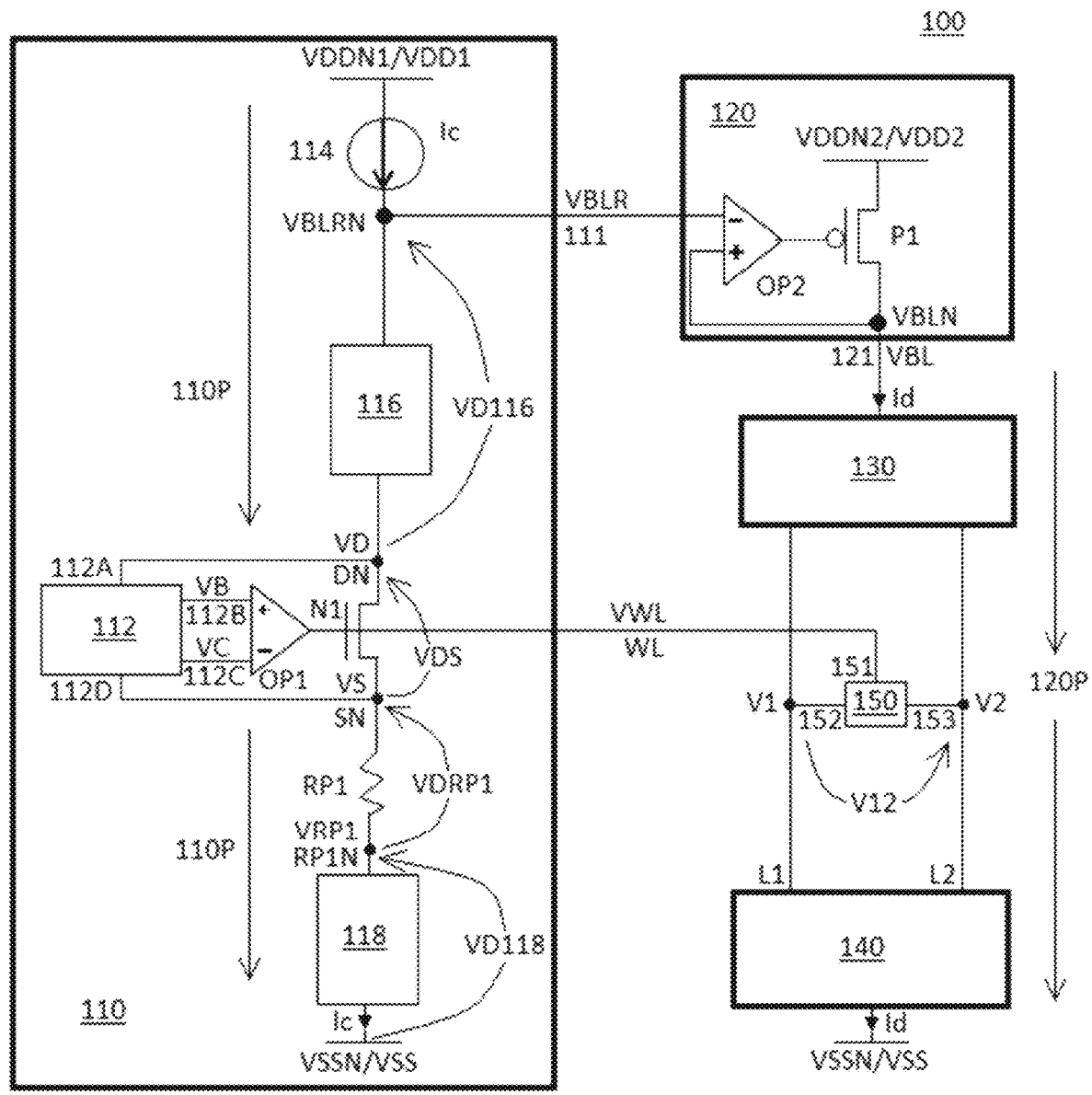
FIGS. 1A-1D are diagrams of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a circuit is configured to generate a bias voltage and/or an activation voltage for RRAM programming and/or read operations by including a current source and a current path, also referred to as a dummy column, having IC elements corresponding to IC elements in columns of an RRAM array. The bias voltage is based on one or more voltage differences generated in the current path by the current from the current source and is used to generate voltage drops across RRAM devices in the programming and/or read operations. The activation voltage is based on a target transistor voltage and is used to control RRAM device selection transistors. By including the current path, the circuit is capable of generating the bias and/or activation voltages having values that vary according to temperature and process-dependent variations in the dummy column IC elements. Because the dummy column IC element variations track those of the corresponding elements in the RRAM columns, the circuit generates the bias and/or activation voltages adapted to temperature and process-dependent variations in RRAM column current path resistance, thereby improving data retention compared to approaches in which bias and activation voltages are generated independent of RRAM column current path resistance.

Figure 1B:
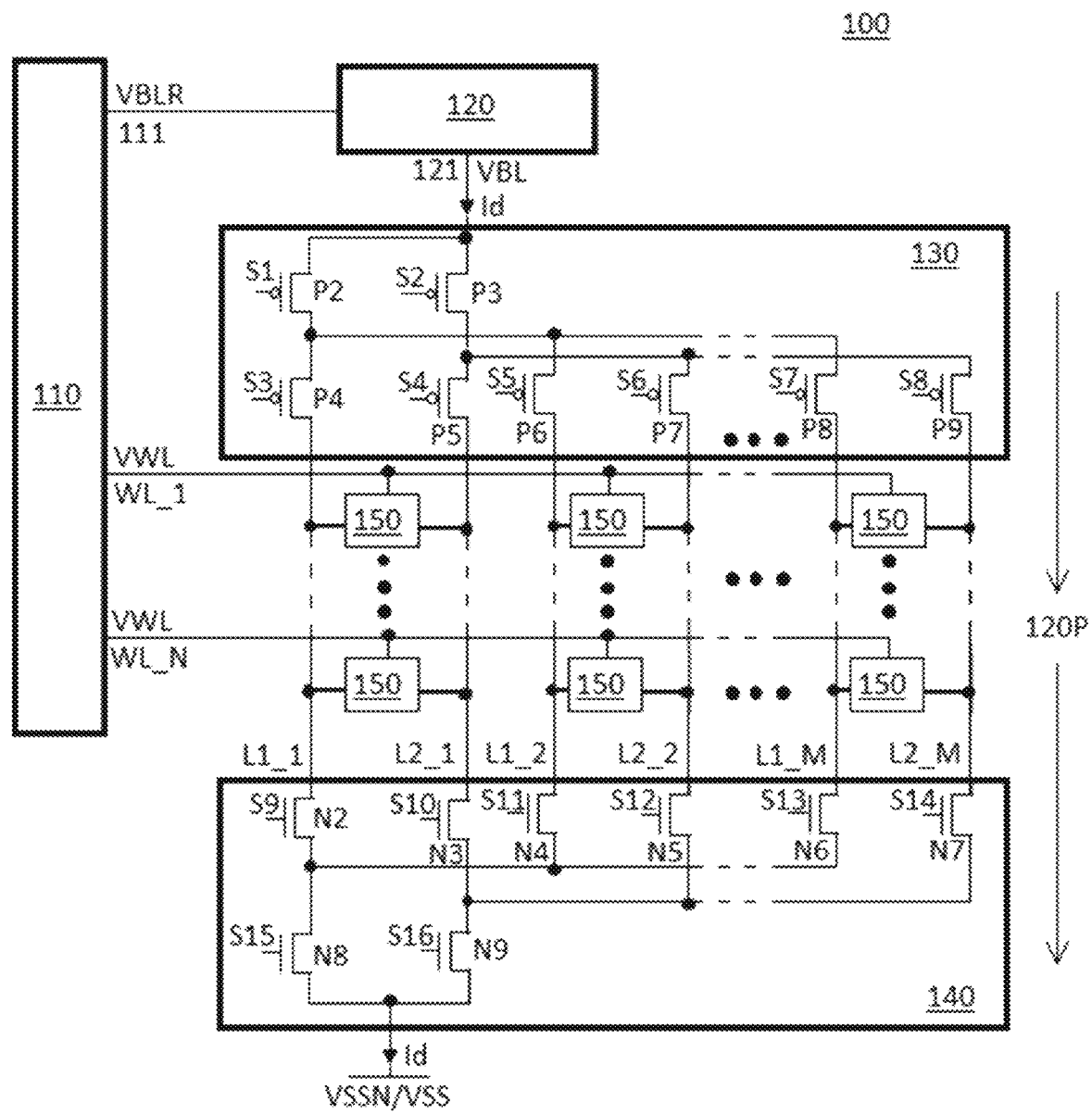
Figure 1C:
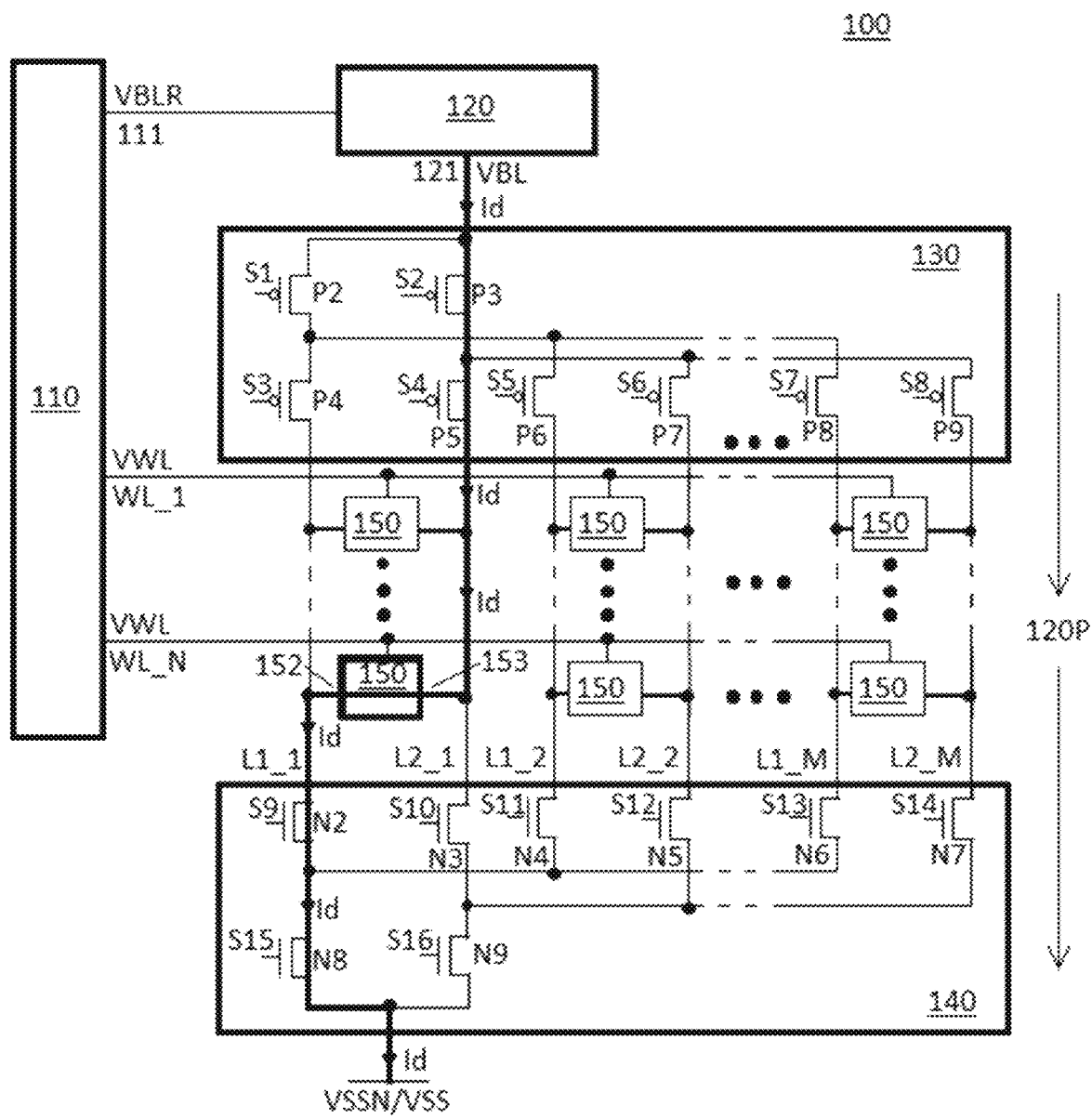
Figure 1D:
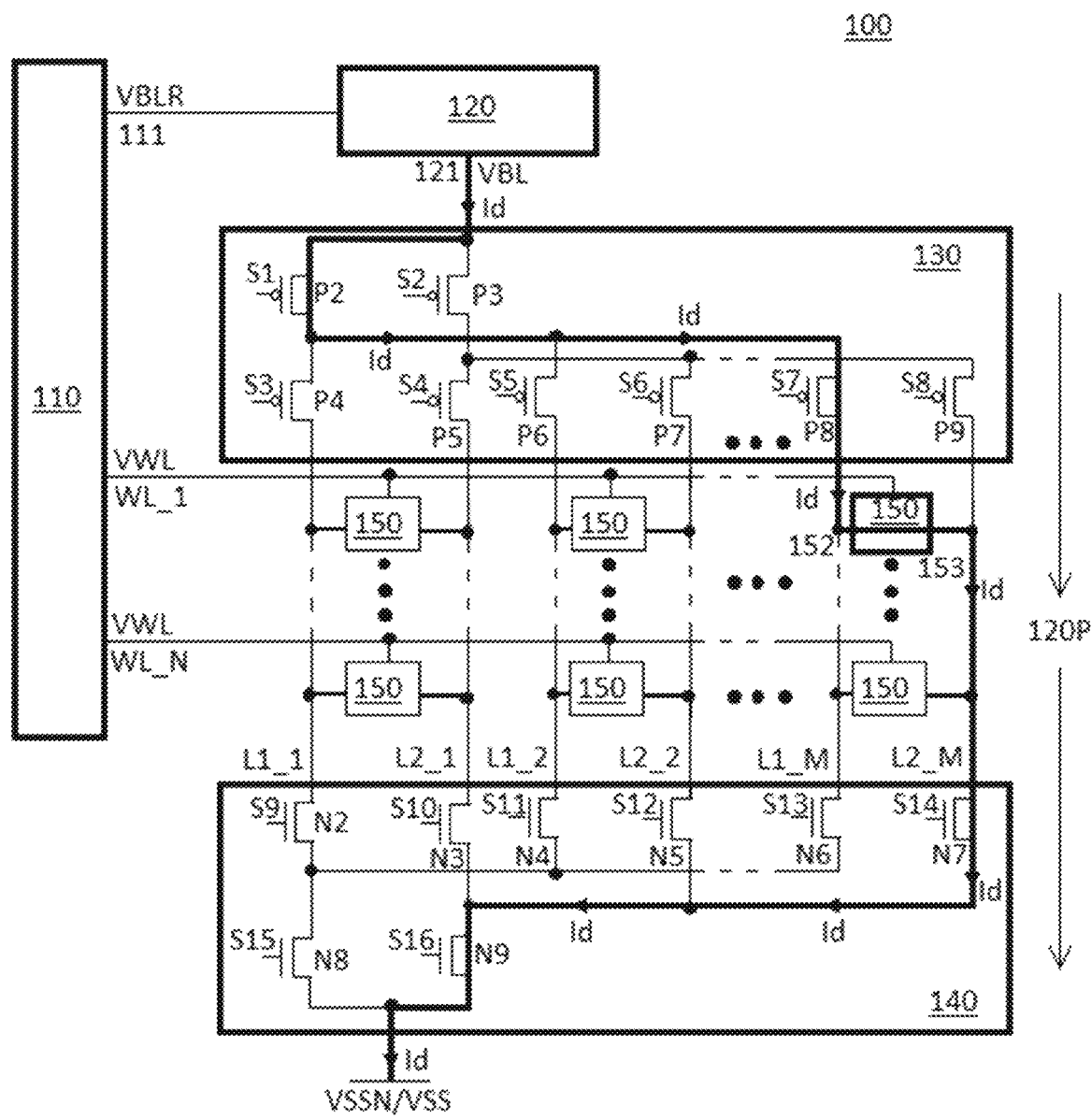

FIGS. 1A-1D are diagrams of a memory circuit 100, in accordance with some embodiments. FIG. 1A depicts details of a bias voltage generator 110 and a drive circuit 120 as related to a single RRAM device 150, and FIGS. 1B-1D depict a relationship between bias voltage generator 110, drive circuit 120, and an array of RRAM devices 150. For the purpose of illustration, FIG. 1A depicts a single RRAM device 150 coupled between conduction lines L1 and L2 used to represent respective conduction lines L1_1-L1_M and L2_1-L2_M collectively, and coupled to a signal line WL used to represent signal line WL_1-WL_N collectively.

In some embodiments, memory circuit 100 is a subset of a memory macro (not shown) that includes one or more additional components, e.g., at least one control or logic circuit or one or more arrays of RRAM devices in addition to the array of RRAM devices 150 depicted in FIGS. 1B-1D.

RRAM device 150 is a memory storage device capable of having either a HRS or a LRS indicative of a logical state. RRAM device 150 includes an input terminal 151 coupled to signal line WL (one of signal lines WL_1-WL_N), a terminal 152 coupled to conduction line L1 (one of conduction lines L1_1-L1_M), and a terminal 153 coupled to conduction line L2 (the corresponding one of conduction lines L2_1-L2_M). RRAM device 150 includes a resistive layer capable of having either insulating properties corresponding to the HRS or conductive properties corresponding to the LRS based on the respective absence or presence of one or more filaments, also referred to as conduction paths. In operation, filaments are formed, thereby setting RRAM devices to the LRS, based on one or more of various mechanisms, e.g., vacancy or defect migration or another suitable mechanism, and broken, thereby resetting RRAM devices to the HRS, based on heating or one or more other suitable mechanisms. In some embodiments, RRAM device 150 is RRAM device 500 discussed below with respect to FIGS. 5A and 5B.

RRAM device 150 includes a selection transistor (not shown in FIGS. 1A-1D) coupled in series with the resistive layer and having a gate coupled to input terminal 151, and is thereby configured to couple RRAM device 150 to conduction line pair L1/L2 (one of conduction line pairs L1_1/L2_1 through L1_M/L2_M) responsive to activation voltage VWL on signal line WL (one of signal lines WL_1-WL_N).

RRAM device 150 is thereby programmable and readable based on a memory cell voltage V12 equal to a difference between a voltage V1 at terminal 152 and a voltage V2 at terminal 153 (not labeled in FIGS. 1B-1D), as reduced by the level of a drain-source voltage across the selection transistor.

Memory circuit 100, or a memory macro including memory circuit 100, is configured so that memory cell voltage V12 has first programming voltage level corresponding to setting RRAM device 150 to the LRS in a first write operation, a second programming voltage level corresponding to resetting RRAM device 150 to the HRS in a second write operation, and a read voltage level corresponding to detecting the LRS or HRS of RRAM device 150 in a read operation.

In various embodiments, each of the first and second write operations and the read operation has a same polarity, or one of the first and second write operations and the read operation has a polarity different from that of the other two of the first and second write operations and the read operation. In each of the first and second write operations and the read operation, memory cell voltage V12 applied to RRAM device 150 causes a current Id to flow between terminals 152 and 153 in a direction determined by the polarity of the memory cell voltage.

As depicted in FIG. 1A, bias voltage generator 110 includes an activation voltage generator 112, an amplifier OP1, and a current path 110P. Current path 110P includes a current source 114, path segments 116 and 118, a transistor N1, and a resistive device RP1 coupled in series between a power supply node VDDN1 and a power reference node VSSN.

Drive circuit 120 includes an amplifier OP2 and a transistor P1 coupled between a power supply node VDDN2 and an output terminal 121. A current path 120P is coupled between drive circuit 120 and power reference node VSSN. Current path 120P includes path segments 130 and 140, conduction lines L1 and L2 (L1_1-L_M and L2_1-L2_M) coupled between path segments 130 and 140, and RRAM device 150 (plurality of RRAM devices 150) coupled between conduction lines L1 and L2 (corresponding conduction lines L1_1-L_M and L2_1-L2_M).

Two or more circuit elements are considered to be coupled based on a direct electrical connection or an electrical connection that includes one or more additional circuit elements and is thereby capable of being controlled, e.g., made resistive or open by a transistor or other switching device.

Bias voltage generator 110 is an electronic circuit configured to output a bias voltage VBLR to an output terminal 111 and/or an activation voltage VWL to signal path WL (signal paths WL_1-WL_N). Bias voltage VBLR and activation voltage VWL have voltage levels based on one or more current levels of a current Ic generated by current source 114, resistance values of current path 110P, and an output of activation voltage generator 112, as discussed below.

Drive circuit 120 is an electronic circuit configured to receive bias voltage VBLR from bias voltage generator 110, generate a drive voltage VBL having a voltage level equal to that of bias voltage VBLR, and output drive voltage VBL to an output terminal 121, as further discussed below.

Current path 120P is a portion of memory circuit 100 configured to receive drive voltage VBL from drive circuit 120 and activation voltage VWL from signal path WL (signal paths WL_1-WL_N) and, responsive to drive voltage VBL and activation voltage VWL, enable current Id to flow between drive circuit 120 and power supply reference node VSSN as part of performing a write or read operation on a given RRAM device 150. In some embodiments, memory circuit 100 is configured to enable current Id to flow by coupling either one of conduction lines L1 or L2 (L1_1-L1_M or L2_1-L2_M) to output terminal 121 and coupling the other one of conduction lines L1 or L2 (L1_1-L1_M or L2_1-L2_M) to power supply reference node VSSN.

Power supply nodes VDDN1 and VDDN2 are voltage nodes configured to carry respective power supply voltages VDD1 and VDD2. In various embodiments, power supply voltage VDD1 has a power supply voltage level less than, equal to, or greater than a power supply voltage level of power supply voltage VDD2. In some embodiments, power supply nodes VDDN1 and VDDN2 are a same voltage node, and power supply voltages VDD1 and VDD2 are a same power supply voltage. In the embodiment depicted in FIGS. 1A-1D, each of power supply voltages VDD1 and VDD2 is an operating voltage having an operating voltage level of a corresponding portion of memory circuit 100.

Power supply reference node VSSN is a voltage node configured to carry a power supply reference voltage VSS, e.g., a ground voltage. In the embodiment depicted in FIGS. 1A-1D, power supply reference voltage VSS has a reference voltage level of memory circuit 100.

Current source 114 is an electronic circuit configured to receive power supply voltage VDD1 from power supply node VDDN1, and generate current Ic having one or more predetermined current levels. In some embodiments, at least one predetermined current level is based on a compliance level of an RRAM device, e.g., RRAM device 150, in a write operation, the compliance level being a maximum current level designed to avoid an undesirable condition, e.g., an overheating and/or damaging stress level, or performance of an unreliable programming operation. In various embodiments, current source 114 is configured to generate current Ic having a predetermined current level equal to a compliance level or to another level derived from the compliance level, e.g., a multiple or fraction of the compliance level.

In some embodiments, current source 114 is configured to generate current Ic having the one or more predetermined current levels ranging from 50 microamperes (PA) to 500 μA. In some embodiments, current source 114 is configured to generate current Ic having the one or more predetermined current levels ranging from 200 μA to 300 μA.

Path segment 116 is one or more IC elements (not depicted in FIGS. 1A-1D), e.g., a transistor and/or metal line, capable of carrying a current, e.g., current Ic, and configured to have a path resistance value based on the portion of current path 120P between drive circuit 120 and RRAM device 150.

In the embodiment depicted in FIGS. 1A-1D, the corresponding portion of current path 120P includes path segment 130 and one of the portion of conduction line L1 (L1_1-L1_M) between drive circuit 120 and terminal 152 of RRAM device 150, or the portion of conduction line L2 (L2_1-L2_M) between drive circuit 120 and terminal 153 of RRAM device 150. In various embodiments, the corresponding portion of current path 120P includes one or more elements (not shown) in addition to and/or instead of one or more of the elements depicted in FIGS. 1A-1D.

In various embodiments, path segment 116 is configured to have the path resistance value equal to that of the corresponding portion of current path 120P or to another level derived from the resistance value of the corresponding portion of current path 120P, e.g., a multiple or fraction of the resistance value of the corresponding portion of current path 120P. In various embodiments, path segment 116 is path segment 300 discussed below with respect to FIG. 3 or path segment 400 discussed below with respect to FIG. 4.

Path segment 116 is coupled to current source 114 at a node VBLRN and to transistor N1 at a node DN and is thereby configured to, in operation, generate a voltage difference VD116 between voltage VBLR on node VBLRN and a voltage VD on node DN.

In the embodiment depicted in FIG. 1A, transistor N1 is an NMOS transistor having a drain terminal coupled to node DN, a source terminal coupled to resistive device RP1 at a node SN, and a gate coupled to an output terminal of amplifier OP1. Transistor N1 is thereby configured to, in operation, generate a voltage difference VDS between voltage VD at node DN and a voltage VS at node SN based on current Ic and an output voltage of amplifier OP1 as further discussed below. In some embodiments, transistor N1 is a PMOS transistor having a source terminal coupled to node DN, a drain terminal coupled to node SN, and a gate coupled to the output terminal of amplifier OP1.

In addition to being based on current Ic and the output of amplifier OP1, a value of voltage difference VDS is based on dimensions of transistor N1. In some embodiments, transistor N1 has dimensions that match those of the selection transistor of RRAM device 150, e.g., transistor N14 of RRAM device 500 discussed below with respect to FIGS. 5A and 5B, such that, for a given transistor bias defined by the current level of current Ic and the output voltage of amplifier OP1, transistor N1 generates voltage difference VDS having a value equal to a value of the drain-source voltage of the selection transistor having the same transistor bias. In various embodiments, transistor N1 has dimensions related to those of the selection transistor such that, for the given transistor bias, transistor N1 generates voltage difference VDS having a value derived from the drain-source voltage value, e.g., a multiple or fraction of the drain-source voltage value.

Resistive device RP1 is one or more conductive segments configured to provide a path resistance. The one or more conductive segments have dimensions configured to provide the path resistance having a predetermined resistance value. In various embodiments, the one or more conductive segments include a polycrystalline silicon material (poly), a compound material including silicon, a semiconductor material or compound, or other material suitable for having the predetermined resistance value. In some embodiments, the predetermined resistance value is based on a resistance value of an RRAM device, e.g., RRAM device 150.

In various embodiments, the predetermined resistance value corresponds to the resistance value of the RRAM device in the HRS or the LRS, a resistance value above the resistance value of the RRAM device in the HRS, a resistance value below the resistance value of the RRAM device in the LRS, or a resistance value between the resistance values of the RRAM device in the HRS and the LRS.

In various embodiments, resistive device RP1 is configured to have the predetermined resistance value equal to the RRAM device resistance value or to another value derived from the RRAM device resistance value, e.g., a multiple or fraction of the RRAM device resistance value.

In some embodiments, resistive device RP1 is configured to have the predetermined resistance value ranging from 1 kilo-ohm (kΩ) to 50 kΩ. In some embodiments, resistive device RP1 is configured to have the predetermined resistance value ranging from 2 kΩ to 5 kΩ.

Resistive device RP1 is coupled to path segment 118 at a node RP1N and is thereby configured to, in operation, generate a voltage difference VDRP1 between voltage VS on node SN and a voltage VRP1 on node RP1N.

Path segment 118 is one or more IC elements (not depicted in FIGS. 1A-1D), e.g., a transistor and/or metal line, capable of carrying a current, e.g., current Ic, and configured to have a path resistance value based on the portion of current path 120P between RRAM device 150 and power supply reference node VSSN.

In the embodiment depicted in FIGS. 1A-1D, the corresponding portion of current path 120P includes path segment 140 and one of the portion of conduction line L1 (L1_1-L1_M) between path segment 140 and terminal 152 of RRAM device 150, or the portion of conduction line L2 (L2_1-L2_M) between path segment 140 and terminal 153 of RRAM device 150. In various embodiments, the corresponding portion of current path 120P includes one or more elements (not shown) in addition to and/or instead of one or more of the elements depicted in FIGS. 1A-1D.

In some embodiments, the portion of current path 120P corresponding to path segment 116 includes path segment 130 and the portion of one of conduction lines L1 or L2 (L1_1-L1_M or L2_1-L2_M) between path segment 130 and a given RRAM device 150, and the portion of current path 120P corresponding to path segment 118 includes the portion of the other of conduction lines L1 or L2 (L1_1-L1_M or L2_1-L2_M) between path segment 140 and the given RRAM device 150.

In various embodiments, path segment 118 is configured to have the path resistance value equal to that of the corresponding portion of current path 120P or to another level derived from the resistance value of the corresponding portion of current path 120P, e.g., a multiple or fraction of the resistance value of the corresponding portion of current path 120P. In various embodiments, path segment 118 is path segment 300 discussed below with respect to FIG. 3 or path segment 400 discussed below with respect to FIG. 4.

Path segment 118 is coupled to power supply reference node VSSN and is thereby configured to, in operation, generate a voltage difference VD118 between voltage VRP1 on node RP1N and power supply reference voltage VSS on power supply reference node VSSN.

Amplifier OP1 is an operational amplifier including, in addition to the output terminal coupled to the gate of transistor N1, a non-inverting input terminal coupled to an output terminal 112B of activation voltage generator 112, and an inverting input terminal coupled to an output terminal 112C of activation voltage generator 112.

Activation voltage generator 112 is an electronic circuit including, in addition to output terminals 112B and 112C, an input terminal 112A coupled to node DN, and an input terminal 112D coupled to node SN. In various embodiments, either input terminal 112A is coupled to output terminal 112B, or input terminal 112D is coupled to output terminal 112C. In some embodiments, activation voltage generator 112 does not include one or both of input terminals 112A or 112D.

Activation voltage generator 112 includes a resistive device (not depicted in FIGS. 1A-1D) that includes a resistive material and is configured to control voltage difference VDS to have a target value based on current flow through the resistive device as discussed below. In some embodiments, the resistive material has a temperature-coefficient of resistance (TCR) corresponding to a metal, such that the target value of voltage difference VDS increases with temperature in accordance with the TCR. In some embodiments, the resistive material includes a metal, e.g., copper (Cu), silver (Ag), tungsten (W), titanium (Ti), nickel (Ni), tin (Sn), aluminum (Al), and/or another metal, and/or another material suitable for having the TCR properties.

In some embodiments, the resistive material has a TCR corresponding to poly and therefore smaller than a TCR corresponding to a metal. In such embodiments, the target value of voltage difference VDS increases with temperature to a substantially lesser degree than in embodiments in which the resistive material has a TCR corresponding to a metal. In various embodiments, the resistive material includes poly, a compound material including silicon, a semiconductor material or compound, or other material suitable for having the TCR properties.

In embodiments in which input terminal 112D is coupled to output terminal 112C, activation voltage generator 112 is thereby configured to, in operation, output voltage VS received at input terminal 112D as a voltage VC on output terminal 112C, and thereby to the inverting input of amplifier OP1. In such embodiments, activation voltage generator 112 is configured to output a voltage VB based on the current flow through the resistive device to output terminal 112B, and thereby to the non-inverting input of amplifier OP1. In various embodiments, activation voltage generator 112 is configured to generate voltage VB based on voltage VD received at input terminal 112A or based on an internal reference voltage independent of voltage VD. In various embodiments, activation voltage generator 112 is activation voltage generator 200A discussed below with respect to FIG. 2A or activation voltage generator 200B discussed below with respect to FIG. 2B.

In embodiments in which input terminal 112A is coupled to output terminal 112B, activation voltage generator 112 is thereby configured to, in operation, output voltage VD received at input terminal 112A as voltage VB on output terminal 112B, and thereby to the non-inverting input of amplifier OP1. In such embodiments, activation voltage generator 112 is configured to output voltage VC based on the current flow through the resistive device to output terminal 112C, and thereby to the inverting input of amplifier OP1. In various embodiments, activation voltage generator 112 is configured to generate voltage VC based on voltage VS received at input terminal 112D or based on an internal reference voltage independent of voltage VS. In some embodiments, activation voltage generator 112 is activation voltage generator 200C discussed below with respect to FIG. 2C.

In operation, amplifier OP1 generates an output voltage based on a difference between voltages VC and VB received at the respective inverting and non-inverting inputs, and the output voltage drives the gate of transistor N1. Amplifier OP1 thereby controls a conductance level of transistor N1, causing voltage VD to differ from voltage VS by the target value of voltage difference VDS equal to the difference between voltages VC and VB output by activation voltage generator 112. Activation voltage generator 112, amplifier OP1, and transistor N1 are thereby configured in a closed loop capable of controlling voltage VDS for a given current level of current Ic.

In some embodiments, activation voltage generator 112 is configured to generate the target value of voltage difference VDS ranging from 200 millivolts (mV) to 600 mV. In some embodiments, activation voltage generator 112 is configured to generate the target value of voltage difference VDS ranging from 200 mV to 500 mV.

In some embodiments, bias voltage generator 110 is configured to output the output voltage of amplifier OP1 to signal path WL as activation voltage VWL as depicted in FIG. 1A. In some embodiments, bias voltage generator 110 includes a selection circuit (not shown), e.g., a multiplexer, and is thereby configured to output activation voltage VWL to signal paths WL_1-WL_N as depicted in FIGS. 1B-1D. In some embodiments, memory circuit 100 includes one or more switching and/or selection circuits (not shown) external to bias voltage generator 110 and is thereby configured to output activation voltage VWL to signal paths WL_1-WL_N.

By being configured to generate and output activation voltage VWL based on the current level of current Ic, and based on the target value of voltage difference VDS output by activation voltage generator 112, bias voltage generator 110 and memory circuit 100 are capable of controlling the drain-source voltage of the selection transistor of an RRAM device, e.g., RRAM device 150, to have a range of values smaller than that of a memory circuit that does not include bias voltage generator 110.

In an RRAM device, e.g., RRAM device 150, the drain-source voltage of the selection transistor acts to reduce a received voltage, e.g., memory cell voltage V12, used to bias the resistive layer in operation. Thus, the relatively smaller range of drain-source voltage values enables improved control of bias levels of resistive layers in RRAM devices in write and read operations, thereby improving data retention compared to approaches in which RRAM selection transistors do not receive activation voltage VWL generated by bias voltage generator 110.

By the arrangement depicted in FIG. 1A and discussed above, bias voltage generator 110 is configured to, in operation, generate bias voltage VBLR at node VBLRN based on current Ic and as the sum of voltage difference VD116 across path segment 116 and between nodes VBLRN and DN, voltage difference VDS across transistor N1 and between nodes DN and SN, voltage difference VDRP1 across resistive device RP1 and between nodes SN and RP1N, and voltage difference VD118 across path segment 118 and between node RP1N and power supply reference node VSSN.

In various embodiments, bias voltage generator 110 does not include one or more of path segment 116, transistor N1, resistive device RP1, or path segment 118, and is thereby configured to generate bias voltage VBLR as the sum of voltage differences that do not include the corresponding one or more of voltage differences VD116, VDS, VDRP1, or VD118.

In various embodiments, bias voltage generator 110 includes one or more IC elements (not shown) other than or in addition to path segment 116, transistor N1, resistive device RP1, or path segment 118, and is thereby configured to generate bias voltage VBLR as the sum including one or more voltage differences corresponding to the one or more IC elements.

By the configuration discussed above, bias voltage generator 110 includes current path 110P configured to receive current Ic from current source 114, and generate bias voltage VBLR based on the one or more voltage differences generated from conduction of current Ic in current path 110P.

In some embodiments, bias voltage generator 110 is configured to generate bias voltage VBLR having voltage levels ranging from 0.5 volts (V) to 3.0 V. In some embodiments, bias voltage generator 110 is configured to generate bias voltage VBLR having voltage levels ranging from 1.5 V to 2.5 V.

In the embodiment depicted in FIGS. 1A-1D, bias voltage generator 110 is configured to output bias voltage VBLR to output terminal 111, and drive circuit 120 is configured to generate drive voltage VBL based on bias voltage VBLR. In some embodiments, bias voltage generator 110 does not include output terminal 111, and drive circuit 120 is otherwise configured to generate drive voltage VBL.

Amplifier OP2 of drive circuit 120 is an operational amplifier including an inverting input terminal configured to receive bias voltage VBLR, a non-inverting input terminal coupled to a node VBLN, and an output terminal coupled to a gate of transistor P1. Transistor P1 is a PMOS transistor having a source terminal coupled to power supply node VDDN2 and a drain terminal coupled to node VBLN, in addition to the gate coupled to the output of amplifier OP2.

Amplifier OP2 and transistor P1 are thereby configured as a closed loop that, in operation, causes amplifier OP2 to modulate the gate of transistor P1, and thereby generate drive voltage VBL on node VBLN having a voltage level equal to that of bias voltage VBLR.

As depicted in FIG. 1A, drive circuit 120 is thereby configured to output drive voltage VBL to output terminal 121 based on received bias voltage VBLR. In some embodiments, drive circuit 120 is otherwise configured to output drive voltage VBL based on received bias voltage VBLR. In various embodiments, drive circuit 120 is configured to output drive voltage VBL having a voltage level equal to that of bias voltage VBLR or having a voltage otherwise related to that of bias voltage VBLR, e.g., a multiple or fraction of bias voltage VBLR.

As depicted in the simplified diagram of FIG. 1A, path segment 130 is configured to couple one of conduction lines L1 or L2 to output terminal 121, and path segment 140 is configured to couple the other of conduction lines L1 or L2 to power reference node VSSN. Responsive to activation voltage VWL received on signal line WL, RRAM device 150 is coupled to conduction lines L1 and L2 such that current path 120P is established between drive circuit 120 and to power reference node VSSN.

Conduction lines L1 and L2 depicted in FIG. 1A and conduction lines L1_1-L1_M and L2_1-L2_M depicted in FIGS. 1B-1D are data lines configured to provide low resistance paths between various circuit elements, e.g., path segments 130 and 140 and RRAM devices 150. A low resistance path includes one or more materials configured to generate a voltage drop below a predetermined limit based on expected current flows, in operation. In some embodiments, conduction lines L1 and L2 (L1_1-L1_M and L2_1-L2_M) include a metal, e.g., copper (Cu), silver (Ag), tungsten (W), titanium (Ti), nickel (Ni), tin (Sn), aluminum (Al), and/or another metal, and/or another material suitable for having the resistance properties.

Path segment 130 is one or more IC elements, e.g., a transistor and/or metal line, capable of selectively establishing a current path from output terminal 121 to any one of conduction lines L1 or L2 (L1_1-L1_M or L2_1-L2_M). In the embodiment depicted in FIG. 1B-1D, path segment 130 includes PMOS transistors P2-P9.

Transistor P4 is coupled between transistor P2 and conduction line L1_1, transistor P6 is coupled between transistor P2 and conduction line L1_2, transistor P8 is coupled between transistor P2 and conduction line L1_M, and transistor P2 is coupled to output terminal 121. Transistor P5 is coupled between transistor P3 and conduction line L2_1, transistor P7 is coupled between transistor P3 and conduction line L2_2, transistor P9 is coupled between transistor P3 and conduction line L2_M, and transistor P3 is coupled to output terminal 121.

Transistors P2-P9 include gates and are thereby configured to receive respective signals S1-S8. Signals S1-S8 have logical levels configured to control transistors P2-P9 so as to establish the portion of current path 120P as a single current path from output terminal 121 to a predetermined one of conduction lines L1_1-L_M or L2_1-L2_M.

Path segment 140 is one or more IC elements, e.g., a transistor and/or metal line, capable of selectively establishing a current path from any one of conduction lines L1 or L2 (L1_1-L1_M or L2_1-L2_M) to power reference node VSSN. In the embodiment depicted in FIGS. 1B-1D, path segment 140 includes NMOS transistors N2-N9.

Transistor N2 is coupled between transistor N8 and conduction line L1_1, transistor N4 is coupled between transistor N8 and conduction line L1_2, transistor N6 is coupled between transistor N8 and conduction line L1_M, and transistor N8 is coupled to power reference node VSSN. Transistor N3 is coupled between transistor N9 and conduction line L2_1, transistor N5 is coupled between transistor N9 and conduction line L2_2, transistor N7 is coupled between transistor N9 and conduction line L2_M, and transistor N9 is coupled to power reference node VSSN.

Transistors N2-N9 include gates and are thereby configured to receive respective signals S9-S16. Signals S9-S16 have logical levels configured to control transistors N2-N9 so as to establish the portion of current path 120P as a single current path from a predetermined one of conduction lines L1_1-L1_M or L2_1-L2_M to power reference node VSSN.

RRAM devices 150 are arranged in N rows, and each RRAM device 150 of a given row is coupled to a corresponding one of signal lines WL_1-WL_N. Each RRAM device 150 of a given row is thereby configured to be coupled to a corresponding one of conduction line pairs L1_1/L2_1 through L1_M/L2_M responsive to activation voltage VWL on the corresponding one of signal lines WL_1-WL_N.

Path segments 130 and 140 and plurality of RRAM devices 150 are thereby configured to establish current path 120P including one of RRAM devices 150 responsive to activation voltage VWL and signals S1-S16.

In the embodiment depicted in FIGS. 1B-1D, based on the configurations of path segments 130 and 140, each RRAM device 150 is capable of being biased by drive voltage VBL in either polarity. In various embodiments, path segments 130 and 140 are otherwise configured such that each RRAM device 150 is capable of being biased by drive voltage VBL in either polarity or such that each RRAM device 150 is capable of being biased in a single one of two polarities.

FIGS. 1C and 1D depict non-limiting examples of biasing operations in which drive voltage VBL is applied to a selected RRAM device 150, thereby causing current Id to flow through differing configurations of current path 120P. In each example, the given configuration of current path 120P includes a total of two PMOS transistors in path segment 130, two NMOS transistors in path segment 140, and portions of each conduction line of one of conduction line pairs L1_1/L2_1 through L1_M/L2_M, a sum of the portions being approximately equal to an entirety of a single one of conduction lines L1_1-L1_M or L2_1-L2_M.

As illustrated in FIGS. 1C and 1D, path segment 116 configured to have a path resistance corresponding to two PMOS transistors and one half of one of conduction lines L1_1-L1_M or L2_1-L2_M thereby corresponds to the portion of current path 120P between drive circuit 120 and the selected RRAM device 150, and path segment 118 configured to have a path resistance corresponding to one half of one of conduction lines L1_1-L1_M or L2_1-L2_M and two NMOS transistors thereby corresponds to the portion of current path 120P between the selected RRAM device 150 and power reference node VSSN.

In the non-limiting example of a write or read biasing operation depicted in FIG. 1C, signals S2 and S4 cause respective transistors P3 and P5 to switch on, thereby establishing the portion of current path 120P between output terminal 121 of drive circuit 120 and conduction line L2_1. In the biasing operation, signals S9 and S15 cause respective transistors N2 and N8 to switch on, thereby establishing the portion of current path 120P between conduction line L1_1 and power reference node VSSN. Activation voltage VWL output to signal line WL_N causes a selected RRAM device 150 (highlighted in FIG. 1C) to be biased based on drive voltage VBL such that current Id flows from terminal 153 to terminal 152 and along the highlighted current path 120P.

In the non-limiting example of a write or read biasing operation depicted in FIG. 1D, signals S1 and S7 cause respective transistors P2 and P8 to switch on, thereby establishing the portion of current path 120P between output terminal 121 of drive circuit 120 and conduction line L_M. In the biasing operation, signals S14 and S16 cause respective transistors N7 and N9 to switch on, thereby establishing the portion of current path 120P between conduction line L2_M and power reference node VSSN. Activation voltage VWL output to signal line WL_1 causes a selected RRAM device 150 (highlighted in FIG. 1D) to be biased based on drive voltage VBL such that current Id flows from terminal 152 to terminal 153 and along the highlighted current path 120P.

In the embodiment depicted in FIGS. 1A-1D, each RRAM device 150 is configured to be selected in write and read operations based on activation voltage VWL received from bias voltage generator 110 as discussed above. In some embodiments, memory circuit 100 includes RRAM devices 150 otherwise configured to receive an activation voltage so as to be selected in write and read operations.

By the configuration discussed above, memory circuit 100 is capable of generating bias voltage VBLR and/or activation voltage VWL based on voltage differences generated from current Ic flowing in current path 110P. The voltage differences are generated based on current path components having properties related to those of the corresponding components of current path 120P such that temperature and process-dependent variations in the resistance values of current path 120P are reflected as temperature and process-dependent variations in the resistance values of current path 110P. Because bias voltage VBLR and/or activation voltage VWL have values that vary in accordance with the resistance variations of current path 110P, bias voltage VBLR and/or activation voltage VWL have values that are adapted to temperature and process-dependent variations in resistance values of current path 120P including a given RRAM device 150. In write and read operations, data retention is thereby improved compared to approaches in which bias and activation voltages are generated independent of RRAM current path resistance values.

Figure 2A:
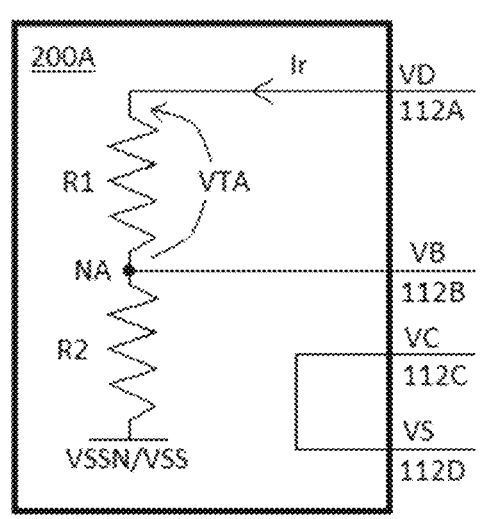
FIGS. 2A-2C are diagrams of activation voltage generators, in accordance with some embodiments.
Figure 2C:
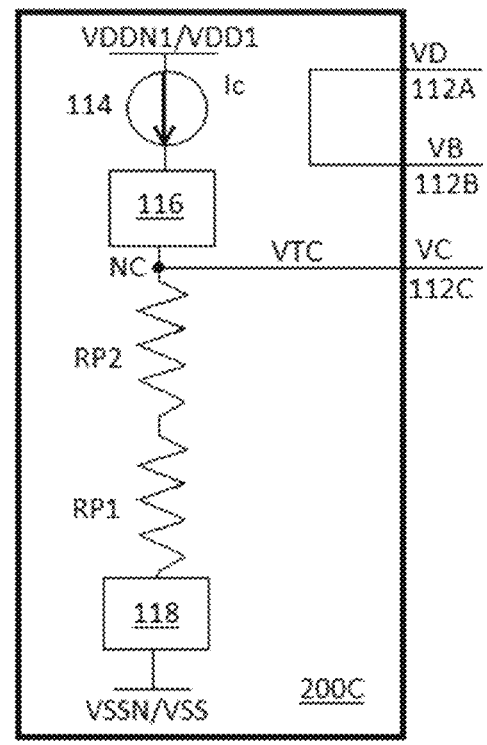
Figure 2B:
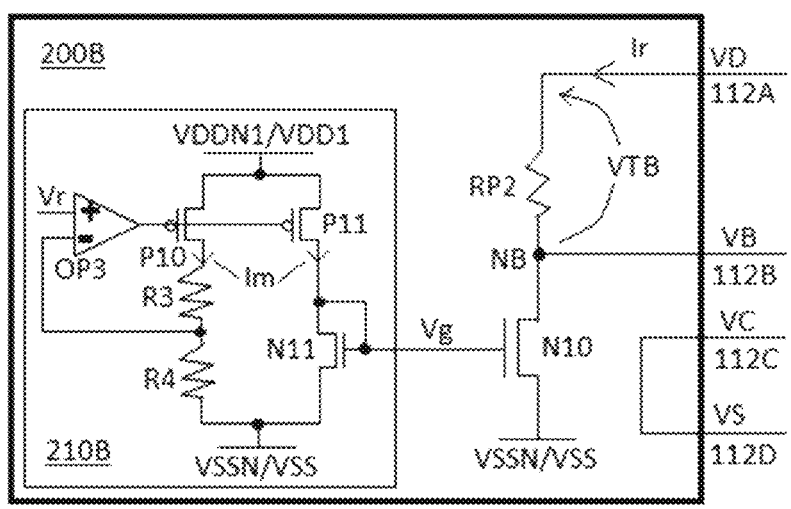

FIGS. 2A-2C are diagrams of respective activation voltage generators 200A-200C, in accordance with some embodiments. Each of activation voltage generators is usable as some or all of activation voltage generator 112, discussed above with respect to FIG. 1. Each of activation voltage generators 200A and 200B includes input terminal 112D configured to receive voltage VS, and each of activation voltage generators 200A-200C includes input terminal 112A configured to receive voltage VD and output terminals 112B and 112C configured to output respective voltages VB and VC, each discussed above with respect to FIG. 1.

Activation voltage generator 200A includes input terminal 112D coupled to output terminal 112C, and resistive devices R1 and R2 coupled in series between input terminal 112A and power reference node VSSN. Resistive devices R1 and R2 are coupled to each other and to output terminal 112B at a node NA.

Resistive devices R1 and R2 are thereby arranged as a voltage divider configured to receive voltage VD on input terminal 112A and generate a voltage difference VTA between node NA and input terminal 112A based on resistance values of resistive devices R1 and R2 and a resultant current Ir.

Each of resistive devices R1 and R2 is one or more conductive segments configured to provide a path resistance. The one or more conductive segments have dimensions configured to provide path resistances having predetermined resistance values. In various embodiments, the one or more conductive segments include a poly, a compound material including silicon, a semiconductor material or compound, and/or a metal, e.g., copper (Cu), silver (Ag), tungsten (W), titanium (Ti), nickel (Ni), tin (Sn), aluminum (Al), and/or another and/or another material suitable for having the predetermined resistance values. In some embodiments, the predetermined resistance values are based on resistance values of selection transistors of RRAM devices, e.g., RRAM device 150 discussed above with respect to FIGS. 1A-1D.

By including resistive devices R1 and R2 having the predetermined resistance values, activation voltage generator 200A is configured to generate voltage difference VTA between voltage VB output to output terminal 112B and voltage VD received at input terminal 112A having a value usable as the target value of voltage difference VDS discussed above with respect to activation voltage generator 112 and FIG. 1A.

Activation voltage generator 200B includes input terminal 112D coupled to output terminal 112C, and a resistive device RP2 coupled in series with a transistor N10 between input terminal 112A and power reference node VSSN. Resistive device RP2 is coupled to transistor N10 and to output terminal 112B at a node NB.

Resistive device RP2 is thereby configured to receive voltage VD on input terminal 112A and generate a voltage difference VTB between node NB and input terminal 112A based on a resistance value of resistive device RP2 and current Ir as controlled by transistor N10.

Resistive device RP2 is one or more conductive segments configured to provide a path resistance. The one or more conductive segments have dimensions configured to provide path resistances having predetermined resistance values. In various embodiments, the one or more conductive segments include a poly, a compound material including silicon, a semiconductor material or compound, and/or a metal, e.g., copper (Cu), silver (Ag), tungsten (W), titanium (Ti), nickel (Ni), tin (Sn), aluminum (Al), and/or another material suitable for having the predetermined resistance values. In some embodiments, the predetermined resistance values are based on resistance values of selection transistors of RRAM devices, e.g., RRAM device 150 discussed above with respect to FIGS. 1A-1D.

Transistor N10 is configured to control current Ir based on a gate voltage Vg. In the embodiment depicted in FIG. 2B, activation voltage generator 200B includes a gate bias circuit 210B configured to generate gate voltage Vg. In various embodiments, activation voltage generator 200B is otherwise configured to generate gate voltage Vg capable of controlling current Ir so as to generate voltage difference VTB.

Gate bias circuit 210B includes an amplifier OP3 configured to receive a voltage Vr at a non-inverting input terminal, a PMOS transistor P10 and resistive devices R3 and R4 coupled in series between power supply node VDDN1 and power reference node VSSN, and a PMOS transistor P11 and an NMOS transistor N11 coupled in series between power supply node VDDN1 and power reference node VSSN. An output terminal of amplifier OP3 is coupled to gates of transistors P10 and P11, and an inverting input terminal of amplifier OP3 is coupled to a terminal of each of resistive devices R3 and R4. Transistor N11 is configured as a diode having a gate coupled to drain terminals of each of transistors P11 and N11, and configured to output gate voltage Vg.

Amplifier OP3 is thereby configured to drive the gate of transistor P10 so that, in operation, a voltage (not labeled) developed across resistive device R4 is equal to voltage Vr based on a current Im. Because amplifier OP3 also drives the gate of transistor P11, current Im is mirrored through transistors P11 and P10, and thereby determines a voltage level of gate voltage Vg based on a voltage level of voltage Vr. Bias circuit 210B is thereby configured to output gate voltage Vg capable of controlling current Ir through transistor N10 and responsive to voltage Vr.

By including resistive device RP2 having the predetermined resistance value and transistor N10 configured to control current Ir through resistive device RP2, activation voltage generator 200B is configured to generate voltage difference VTB between voltage VB output to output terminal 112B and voltage VD received at input terminal 112A having a value usable as the target value of voltage difference VDS discussed above with respect to activation voltage generator 112 and FIG. 1A.

Activation voltage generator 200C includes input terminal 112A coupled to output terminal 112B, and current source 114, path segments 116 and 118, and resistive devices RP1 and RP2 coupled in series between power supply node VDDN1 and power reference node VSSN. Each of current source 114, path segments 116 and 118, and resistive device RP1 is discussed above with respect to memory circuit 100 and FIGS. 1A-1D, and resistive device RP2 is discussed above with respect to activation voltage generator 200B and FIG. 2B.

Path segment 116, resistive device RP2, and output terminal 112C are coupled together at a node NC, and activation voltage generator 200C is thereby configured to generate voltage VC with respect to power supply reference voltage VSS.

By including resistive device RP2 having the predetermined resistance value and current source 114, path segments 116 and 118, and resistive device RP1 configured to control current Ic through resistive device RP2, activation voltage generator 200C is configured to generate voltage VC and output voltage VC to output terminal 112C having a value usable as a target value of voltage VS of the target value of voltage difference VDS discussed above with respect to activation voltage generator 112 and FIG. 1A.

By the configurations discussed above, each of activation voltage generators 200A-200C operates to generate one of voltages VB or VC having a value based on current flow through one of resistive devices R1 or RP2. By configuring resistive devices R1 and RP2 to have resistance values based on a drain-source voltage of a selection transistor of an RRAM device, e.g., RRAM device 150, each of activation voltage generators 200A-200C generates the one of voltages VB or VC having temperature and process-dependent variations that reflect temperature and process-dependent variations of the selection transistor.

A memory circuit, e.g., memory circuit 100 discussed above with respect to FIGS. 1A-1D, that includes one of activation voltage generators 200A-200C, e.g., as activation voltage generator 112, thereby receives voltages VB and VC having values usable to generate an activation voltage, e.g., activation voltage VWL, that controls RRAM device selection transistors and has temperature and process-dependent variations that reflect temperature and process-dependent variations of the selection transistors. Each of activation voltage generators 200A-200C thereby operates to reduce a range of selection transistor drain-source voltage values, improve control of RRAM device bias levels in write and read operations, and improve data retention compared to approaches in which RRAM selection transistors do not receive activation voltages generated by using one of activation voltage generators 200A-200C, as discussed above with respect to activation voltage generator 112 and with respect to memory circuit 100.

Figure 3:
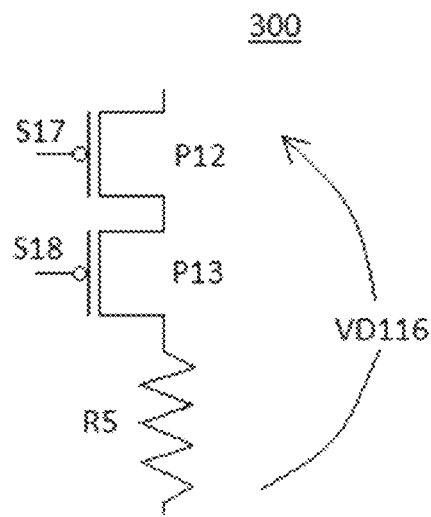
FIG. 3 is a diagram of a path segment, in accordance with some embodiments.

FIG. 3 is a diagram of path segment 300, in accordance with some embodiments. Path segment 300 is usable as part or all of path segments 116 or 118, discussed above with respect to FIG. 1. In the embodiment depicted in FIG. 3, path segment 300 is configured to generate voltage difference VD116 discussed above with respect to memory circuit 100 and FIGS. 1A-1D.

Path segment 300 includes PMOS transistors P12 and P13 coupled in series with a resistive device R5. Gates of transistors P12 and P13 are configured to receive respective signals S17 and S18, and transistors P12 and P13 are thereby controllable to provide a portion of a current path, e.g., current path 110P discussed above with respect to memory circuit 100 and FIGS. 1A-1D.

Values of voltage differences generated across transistors P12 and P13 are based on dimensions of transistors P12 and P13 and on voltage levels of signals S17 and S18. Transistors P12 and P13 have dimensions based on dimensions of one or more transistors in current path 120P discussed above with respect to memory circuit 100 and FIGS. 1A-1D. In some embodiments, one or both of transistors P12 or P13 have dimensions that match those of a transistor in current path 120P, such that, for a given signal voltage level, the one or both of transistors P12 or P13 generates a drain-source voltage difference having a value equal to a value of the drain-source voltage of the corresponding transistor in current path 120P. In various embodiments, one or both of transistors P12 or P13 have dimensions related to those of the corresponding transistor such that the one or both of transistors P12 or P13 generates the drain-source voltage difference having a value derived from the current path 120P transistor drain-source voltage value, e.g., a multiple or fraction of the drain-source voltage value.

In some embodiments, transistor P12 has dimensions that match those of transistors P2 and P3, and transistor P13 has dimensions that match those of transistors P4-P9, discussed above with respect to FIGS. 1B-1D.

In various embodiments, one or both of transistors P12 or P13 is controllable to provide the portion of the current path based on one or both of signals S17 or S18 having voltage levels that match those of one or more of signals S1-S8, discussed above with respect to FIGS. 1B-1D. In some embodiments, one or both of transistors P12 or P13 is controllable to provide the portion of the current path based on one or both of signals S17 or S18 having voltage levels that match that of power supply reference voltage VSS, discussed above with respect to FIGS. 1A-1D.

Resistive device R5 is one or more conductive segments configured to provide a path resistance. In some embodiments, the one or more conductive segments include a resistive material having a TCR corresponding to a metal and dimensions configured to provide the path resistance having a predetermined resistance value. In some embodiments, the resistive material includes a metal, e.g., copper (Cu), silver (Ag), tungsten (W), titanium (Ti), nickel (Ni), tin (Sn), aluminum (Al), and/or another metal, and/or another material suitable for having the TCR properties. In some embodiments, the predetermined resistance value is based on a resistance value of a portion of current path 120P, as discussed above with respect to FIGS. 1A-1D.

In various embodiments, path segment 300 does not include one or more of transistors P12 or P13 or resistive device R5 and is thereby configured to generate a voltage difference, e.g., voltage difference VD116, based on one or two of transistors P12 or P13 or resistive device R5. In various embodiments, path segment 300 includes one or more IC elements (not shown) other than or in addition to transistors P12 or P13 or resistive device R5, and is thereby configured to generate the voltage difference based on the one or more IC elements.

By being included in memory circuit 100 discussed above with respect to FIGS. 1A-1D, path segment 300 operates to achieve the benefits discussed above with respect to memory circuit 100.

Figure 4:
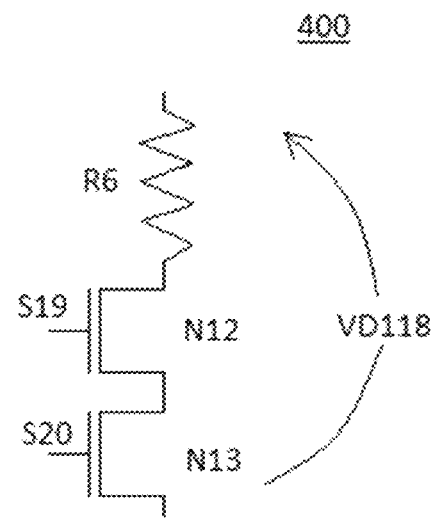
FIG. 4 is a diagram of a path segment, in accordance with some embodiments.

FIG. 4 is a diagram of path segment 400, in accordance with some embodiments. Path segment 400 is usable as part or all of path segments 116 or 118, discussed above with respect to FIG. 1. In the embodiment depicted in FIG. 4, path segment 400 is configured to generate voltage difference VD118 discussed above with respect to memory circuit 100 and FIGS. 1A-1D.

Path segment 400 includes NMOS transistors N12 and N13 coupled in series with a resistive device R6. Gates of transistors N12 and N13 are configured to receive respective signals S19 and S20, and transistors N12 and N13 are thereby controllable to provide a portion of a current path, e.g., current path 110P discussed above with respect to memory circuit 100 and FIGS. 1A-1D.

Values of voltage differences generated across transistors N12 and N13 are based on dimensions of transistors N12 and N13 and on voltage levels of signals S19 and S20. Transistors N12 and N13 have dimensions based on dimensions of one or more transistors in current path 120P discussed above with respect to memory circuit 100 and FIGS. 1A-1D. In some embodiments, one or both of transistors N12 or N13 have dimensions that match those of a transistor in current path 120P, such that, for a given signal voltage level, the one or both of transistors N12 or N13 generates a drain-source voltage difference having a value equal to a value of the drain-source voltage of the corresponding transistor in current path 120P. In various embodiments, one or both of transistors N12 or N13 have dimensions related to those of the corresponding transistor such that the one or both of transistors N12 or N13 generates the drain-source voltage difference having a value derived from the current path 120P transistor drain-source voltage value, e.g., a multiple or fraction of the drain-source voltage value.

In some embodiments, transistor N12 has dimensions that match those of transistors N2-N7, and transistor N13 has dimensions that match those of transistor N8, discussed above with respect to FIGS. 1B-1D.

In various embodiments, one or both of transistors N12 or N13 is controllable to provide the portion of the current path based on one or both of signals S19 or S20 having voltage levels that match those of one or more of signals S9-S16, discussed above with respect to FIGS. 1B-1D. In some embodiments, one or both of transistors N12 or N13 is controllable to provide the portion of the current path based on one or both of signals S19 or S20 having voltage levels that match that of power supply voltage VDD1, discussed above with respect to FIGS. 1A-1D.

Resistive device R6 is one or more conductive segments configured to provide a path resistance. In some embodiments, the one or more conductive segments include a resistive material having a TCR corresponding to a metal and dimensions configured to provide the path resistance having a predetermined resistance value. In some embodiments, the resistive material includes a metal, e.g., copper (Cu), silver (Ag), tungsten (W), titanium (Ti), nickel (Ni), tin (Sn), aluminum (Al), and/or another metal, and/or another material suitable for having the TCR properties. In some embodiments, the predetermined resistance value is based on a resistance value of a portion of current path 120P, as discussed above with respect to FIGS. 1A-1D.

In various embodiments, path segment 400 does not include one or more of transistors N12 or N13 or resistive device R6 and is thereby configured to generate a voltage difference, e.g., voltage difference VD118, based on one or two of transistors N12 or N13 or resistive device R6. In various embodiments, path segment 400 includes one or more IC elements (not shown) other than or in addition to transistors B12 or N13 or resistive device R6, and is thereby configured to generate the voltage difference based on the one or more IC elements.

By being included in memory circuit 100 discussed above with respect to FIGS. 1A-1D, path segment 400 operates to achieve the benefits discussed above with respect to memory circuit 100.

Figure 5A:
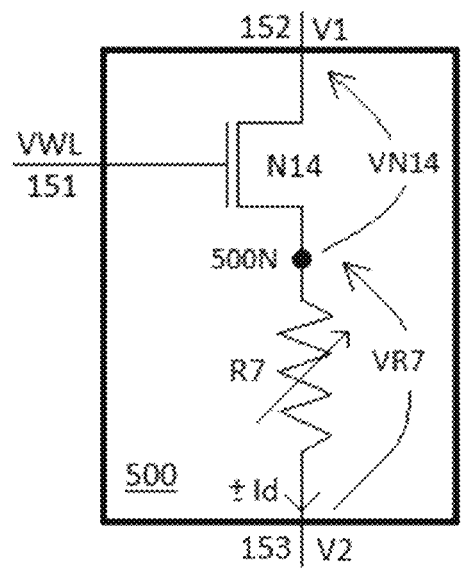
FIGS. 5A and 5B are diagrams of an RRAM device, in accordance with some embodiments.

FIG. 5A is a diagram of RRAM device 500, in accordance with some embodiments. RRAM device 500 is usable as part or all of RRAM device 150, discussed above with respect to FIG. 1. RRAM device 500 includes input terminal 151 configured to receive activation voltage VWL and terminals 152 and 153 configured to have respective voltages V1 and V2 and to conduct current Id, each discussed above with respect to FIG. 1. RRAM device 500 also includes a selection transistor N14 coupled in series with a variable resistance structure R7 at a node 500N. In the embodiment depicted in FIG. 5A, selection transistor N14 is coupled between terminal 152 and variable resistance structure R7. In some embodiments, selection transistor N14 is coupled between terminal 153 and variable resistance structure R7.

Selection transistor N14 includes a gate coupled to input terminal 151 configured to carry a signal (not labeled) that includes either activation voltage VWL or a second voltage level, e.g., a voltage level corresponding to power reference voltage VSS. RRAM device 500 is thereby configured to provide a current path between terminals 152 and 153 that includes variable resistance structure R7 responsive to activation voltage VWL, and interrupt the current path responsive to signal VWL having the second voltage level.

In the embodiment depicted in FIG. 5A, selection transistor N14 is an NMOS transistor. In some embodiments, selection transistor N14 is a PMOS transistor configured to provide the current path between terminals 152 and 153 in response to activation voltage VWL having a negative polarity. In some embodiments, RRAM device 500 does not include selection transistor N14 and is externally controlled so as to selectively provide the current path responsive to activation voltage VWL.

As depicted in FIG. 5A, current Id flowing through RRAM device 500 generates a drain-source voltage difference VN14 across selection transistor N14 and between node 500N and terminal 152, and generates a voltage difference VR7 across variable resistance structure R7 and between terminal 153 and node 500N. Voltage difference VN14 corresponds to the selection transistor drain-source voltage discussed above with respect to memory circuit 100 and FIGS. 1A-1D. Voltage difference VR7 has a voltage level equal to that of drive voltage VBL minus voltage difference VN14 and the voltage drops introduced by the portions of current path 120P discussed above with respect to memory circuit 100 and FIGS. 1A-1D.

Figure 5B:
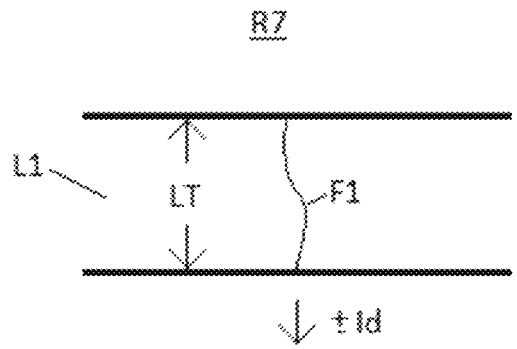

FIG. 5B is a diagram of variable resistance structure R7, in accordance with some embodiments. Variable resistance structure R7 is a microelectronic structure that includes a resistive layer L1 having a thickness LT. In addition to resistive layer L1, variable resistance structure R7 includes one or more features, e.g., conductive elements, that are not depicted in FIG. 5B for the purpose of clarity. In a programming operation, voltage difference VR7 across resistive layer L1 induces formation of a filament F1, thereby providing a current path for current Id.

Resistive layer L1 is one or more layers of dielectric materials configured to receive voltage difference VR7 across thickness LT. In various embodiments, resistive layer L1 includes one or more of an oxide of tungsten (W), tantalum (Ta), titanium (Ti), nickel (Ni), cobalt (Co), hafnium (Hf), ruthenium (Ru), zirconium (Zr), zinc (Zn), iron (Fe), tin (Sn), aluminum (Al), copper (Cu), silver (Ag), molybdenum (Mo), chromium (Cr), or another suitable element, a composite material including, e.g., silicon, or another material capable of having either the HRS or LRS. In some embodiments, resistive layer L1 has thickness LT ranging from 20 nanometers (nm) to 100 nm.

Based on the presence or absence of filament F1, resistive layer L1 has either the LRS or HRS, respectively, as discussed above with respect to RRAM device 150 and FIGS. 1A-1D. In the embodiment depicted in FIG. 5B, resistive layer L1 includes a single filament F1, and thereby a single current path through which current Id flows, in operation. In various embodiments, resistive layer L1 includes one or more filaments (not shown) in addition to filament F1, and thereby a plurality of current paths through which current Id flows, in operation.

In various embodiments, resistive layer L1 has a resistance value ranging from 1 kilo-ohm (kΩ) to 4 kΩ in the LRS and/or a resistance value ranging from 15 kΩ to 30 kΩ in the HRS.

RRAM device 500 is thereby configured to, in operation, generate current Id in response to activation voltage VWL based on voltage difference VR7 and the resistance value of resistive layer L1.

By being included in memory circuit 100 discussed above with respect to FIGS. 1A-1D, RRAM device 500 operates to achieve the benefits discussed above with respect to memory circuit 100.

Figure 6:
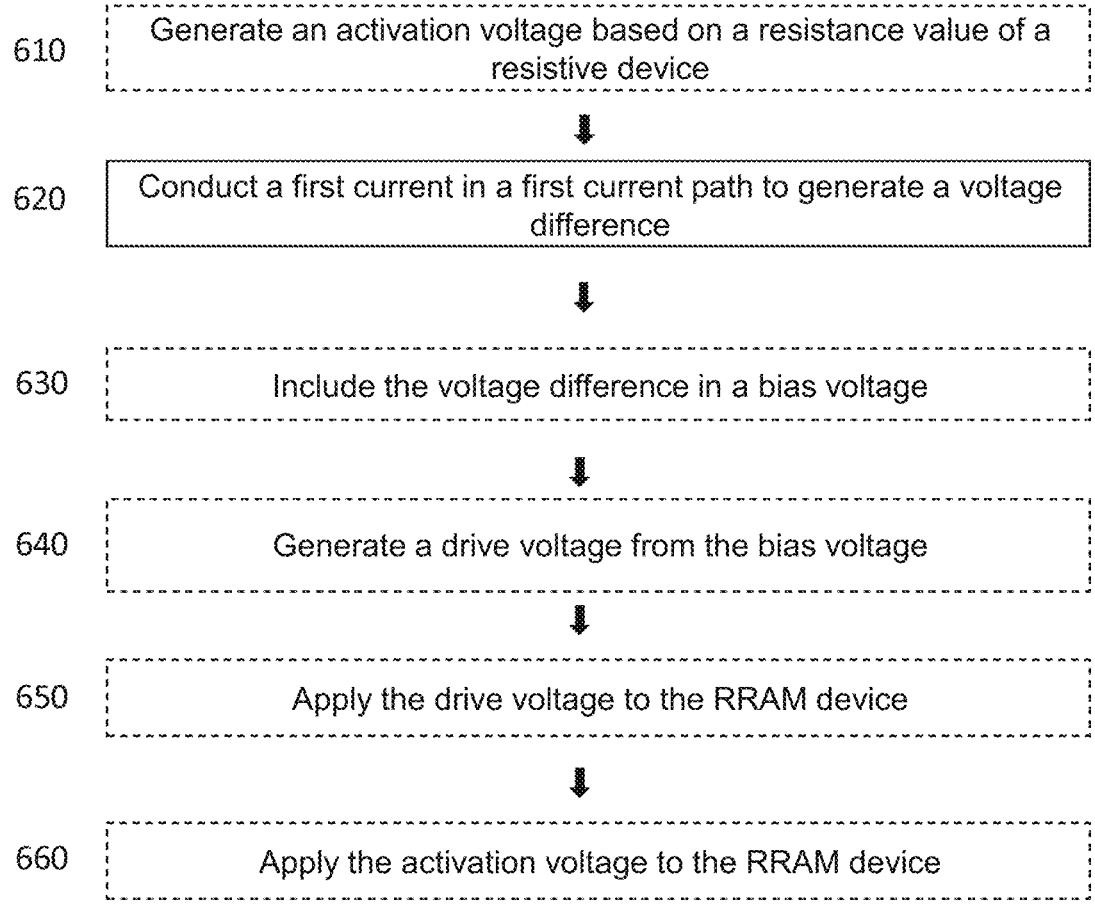
FIG. 6 is a flowchart of a method of generating bias voltages, in accordance with some embodiments.

FIG. 6 is a flowchart of a method 600 of biasing an RRAM device, in accordance with some embodiments. Method 600 is usable with a memory circuit, e.g., memory circuit 100 discussed above with respect to FIGS. 1A-1D.

In some embodiments, biasing the RRAM device using method 600 includes performing a write or read operation on the RRAM device. In some embodiments, biasing the RRAM device using method 600 includes forming a filament, e.g., filament F1 discussed above with respect to RRAM device 500 and FIG. 5B.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are a subset of operations of a method of operating a memory macro.

At operation 610, in some embodiments, an activation voltage is generated based on a resistance value of a resistive device. Generating the activation voltage includes controlling a current across the resistive device to produce a target value of a difference voltage corresponding to a drain-source voltage of a selection transistor of the RRAM device. Based on the target value, an amplifier is used in a closed loop configuration to drive a gate of a transistor to generate a voltage difference, and the gate voltage is generated as the activation voltage.

In some embodiments, generating the activation voltage includes generating activation voltage VWL discussed above with respect to memory circuit 100 and FIGS. 1A-1D.

At operation 620, a first current is conducted in a first current path to generate a voltage difference. Conducting the first current includes conducting the first current having a predetermined current value. The first current path includes at least one IC element that corresponds to an IC element of a second current path that includes the RRAM device.

In some embodiments, conducting the first current in the first current path includes conducting current Ic in current path 110P discussed above with respect to memory circuit 100 and FIGS. 1A-1D.

In some embodiments, conducting the first current in the first current path includes generating the voltage difference across a transistor having a conductance level based on the activation voltage. In some embodiments, generating the voltage difference across the transistor includes generating the voltage difference across transistor N1 discussed above with respect to memory circuit 100 and FIGS. 1A-1D.

In some embodiments, conducting the first current in the first current path includes generating the voltage difference across a path segment having a resistance value based on a portion of the second current path. In some embodiments, generating the voltage difference across the path segment includes generating the voltage difference across one or both of path segments 116 or 118 discussed above with respect to memory circuit 100 and FIGS. 1A-1D.

In some embodiments, conducting the first current in the first current path includes generating the voltage difference across a resistive device having a resistance value based on a resistance value of the RRAM device. In some embodiments, generating the voltage difference across the path segment includes generating the voltage difference across resistive device RP1 discussed above with respect to memory circuit 100 and FIGS. 1A-1D.

At operation 630, in some embodiments, the voltage difference is included in a bias voltage. In various embodiments, including the voltage difference includes including one or more of the voltage differences generated in operation 620. Because the voltage difference is based on at least one element of the first current path corresponding to at least one element of the second current path, including the voltage difference causes the bias voltage to have a value based on a resistance value of the second current path that includes the RRAM device.

In various embodiments, including the voltage difference includes including one or more of voltage differences VD118, VDRP1, VDS, or VD116 discussed above with respect to memory circuit 100 and FIGS. 1A-1D.

At operation 640, in some embodiments, a drive voltage is generated from the bias voltage. In various embodiments, the drive voltage is equal to the bias voltage or otherwise derived from the bias voltage. Because the bias voltage is based on a resistance value of the second current path that includes the RRAM device, the drive voltage derived from the bias voltage is based on the resistance value of the second current path.

In some embodiments, generating the drive voltage includes generating drive voltage VBL discussed above with respect to memory circuit 100 and FIGS. 1A-1D.

At operation 650, in some embodiments, the drive voltage is applied to the RRAM device. Because the drive voltage is based on the resistance value of the second current path, the drive voltage is applied to the RRAM device based on the resistance value of the second current path.

In some embodiments, applying the drive voltage to the RRAM device includes applying drive voltage VBL to RRAM device 150 discussed above with respect to memory circuit 100 and FIGS. 1A-1D.

At operation 660, in some embodiments, the activation voltage is applied to the RRAM device. Because the activation voltage is based on the resistance value of the selection transistor, the activation voltage is applied to the RRAM device based on the resistance value of the selection transistor.

In some embodiments, applying the activation voltage to the RRAM device includes applying activation voltage VWL to RRAM device 150 discussed above with respect to memory circuit 100 and FIGS. 1A-1D.

By executing some or all of the operations of method 600, a bias voltage and/or activation voltage generated as part of biasing an RRAM device in a write or read operation are adapted to temperature and process-dependent variations in the RRAM current path resistance, thereby achieving the benefits discussed above with respect to memory circuit 100.

In some embodiments, a memory circuit includes a bias voltage generator including a first transistor configured to generate a voltage difference based on a first current and an activation voltage, wherein the bias voltage generator is configured to output the activation voltage and a bias voltage based on the voltage difference, a drive circuit configured to receive the bias voltage and output a drive voltage having a voltage level based on the bias voltage, and an RRAM device configured to receive the activation voltage and conduct a second current responsive to the drive voltage and the activation voltage. In some embodiments, the RRAM device includes a selection transistor including a gate configured to receive the activation voltage, and each of the first transistor and the selection transistor is an NMOS transistor. In some embodiments, the first transistor has dimensions that match those of the selection transistor of the RRAM device. In some embodiments, the drive circuit is coupled to the RRAM device through one or more first PMOS transistors having a total number of PMOS transistors, and the bias voltage generator includes a current path including the first transistor and one or more second PMOS transistors having the total number of PMOS transistors. In some embodiments, the one or more first PMOS transistors have dimensions that match those of the one or more second PMOS transistors. In some embodiments, the RRAM device is coupled to a power reference node through one or more first NMOS transistors having a total number of NMOS transistors, and the bias voltage generator includes a current path including the first transistor and one or more second NMOS transistors having the total number of NMOS transistors. In some embodiments, the one or more first NMOS transistors have dimensions that match those of the one or more second NMOS transistors. In some embodiments, the bias voltage generator is configured to output the bias voltage further based on a resistive device coupled in series with the first transistor. In some embodiments, the bias voltage generator includes a current source coupled between a power supply node and the first transistor and configured to generate the first current.

In some embodiments, a memory circuit includes a bias voltage generator including a current source configured to output a first current at a first node, a first resistive device configured to generate, based on the first current, a first voltage at the first node and a second voltage at a second node, a first amplifier configured to output an activation voltage based on the second voltage, and a first transistor coupled between the first and second nodes and configured to generate a voltage difference responsive to the activation voltage, a drive circuit coupled to the first node, and an array of RRAM devices coupled to the drive circuit and including a plurality of signal lines, wherein each signal line of the plurality of signal lines is configured to receive the activation voltage. In some embodiments, an inverting input of the first amplifier is coupled to each of the second node and a source terminal of the first transistor. In some embodiments, the bias voltage generator includes a second resistive device coupled between a drain terminal of the first transistor and a non-inverting input of the first amplifier. In some embodiments, each of the first and second resistive devices includes a polycrystalline silicon material. In some embodiments, the bias voltage generator includes a third resistive device coupled between the non-inverting input of the first amplifier and a power reference node. In some embodiments, the bias voltage generator includes a second amplifier configured to receive a reference voltage, a current mirror configured to generate a gate voltage responsive to an output of the second amplifier, and a second transistor responsive to the gate voltage and coupled between the non-inverting input of the first amplifier and a power reference node. In some embodiments, each RRAM device of the array of RRAM devices includes a selection transistor coupled in series with a resistive layer, the drive circuit includes a second amplifier configured to control a second current through a second transistor responsive to the first voltage, and the selection transistor of each RRAM device of the array of RRAM devices is configured to conduct the second current through the resistive layer responsive to the activation voltage.

In some embodiments, a method of performing a write operation on an RRAM device includes generating an activation voltage based on a resistance value of a resistive device, conducting a first current in a first current path to generate a first voltage difference based on the activation voltage, and applying the activation voltage to the RRAM device, thereby generating a second voltage difference in a selection transistor, the second voltage difference having a value corresponding to a value of the first voltage difference. In some embodiments, generating the activation voltage includes using an amplifier in a closed loop configuration to drive a gate of a transistor with the activation voltage. In some embodiments, generating the first voltage difference includes using the transistor to generate the first voltage difference in response to the activation voltage. In some embodiments, the method includes including the voltage difference in a bias voltage, generating a drive voltage from the bias voltage, and applying the drive voltage to the RRAM device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a bias voltage generator comprising a first transistor configured to generate a voltage difference based on a first current and an activation voltage, wherein the bias voltage generator is configured to output the activation voltage and a bias voltage based on the voltage difference;
a drive circuit configured to receive the bias voltage and output a drive voltage having a voltage level based on the bias voltage; and
a resistive random-access memory (RRAM) device configured to receive the activation voltage and conduct a second current responsive to the drive voltage and the activation voltage.

2. The memory circuit of claim 1, wherein
the RRAM device comprises a selection transistor comprising a gate configured to receive the activation voltage, and
each of the first transistor and the selection transistor is an NMOS transistor.

3. The memory circuit of claim 2, wherein the first transistor has dimensions that match those of the selection transistor of the RRAM device.

4. The memory circuit of claim 1, wherein
the drive circuit is coupled to the RRAM device through one or more first PMOS transistors having a total number of PMOS transistors, and
the bias voltage generator comprises a current path comprising the first transistor and one or more second PMOS transistors having the total number of PMOS transistors.

5. The memory circuit of claim 4, wherein the one or more first PMOS transistors have dimensions that match those of the one or more second PMOS transistors.

6. The memory circuit of claim 1, wherein
the RRAM device is coupled to a power reference node through one or more first NMOS transistors having a total number of NMOS transistors, and
the bias voltage generator comprises a current path comprising the first transistor and one or more second NMOS transistors having the total number of NMOS transistors.

7. The memory circuit of claim 6, wherein the one or more first NMOS transistors have dimensions that match those of the one or more second NMOS transistors.

8. The memory circuit of claim 1, wherein the bias voltage generator is configured to output the bias voltage further based on a resistive device coupled in series with the first transistor.

9. The memory circuit of claim 1, wherein the bias voltage generator comprises a current source coupled between a power supply node and the first transistor and configured to generate the first current.

10. A memory circuit comprising:
a bias voltage generator comprising:
a current source configured to output a first current at a first node;
a first resistive device configured to generate, based on the first current, a first voltage at the first node and a second voltage at a second node;
a first amplifier configured to output an activation voltage based on the second voltage; and
a first transistor coupled between the first and second nodes and configured to generate a voltage difference responsive to the activation voltage;
a drive circuit coupled to the first node; and
an array of resistive random-access memory (RRAM) devices coupled to the drive circuit and comprising a plurality of signal lines, wherein each signal line of the plurality of signal lines is configured to receive the activation voltage.

11. The memory circuit of claim 10, wherein an inverting input of the first amplifier is coupled to each of the second node and a source terminal of the first transistor.

12. The memory circuit of claim 11, wherein the bias voltage generator comprises a second resistive device coupled between a drain terminal of the first transistor and a non-inverting input of the first amplifier.

13. The memory circuit of claim 12, wherein each of the first and second resistive devices comprises a polycrystalline silicon material.

14. The memory circuit of claim 12, wherein the bias voltage generator comprises a third resistive device coupled between the non-inverting input of the first amplifier and a power reference node.

15. The memory circuit of claim 12, wherein the bias voltage generator comprises:
a second amplifier configured to receive a reference voltage;
a current mirror configured to generate a gate voltage responsive to an output of the second amplifier; and
a second transistor responsive to the gate voltage and coupled between the non-inverting input of the first amplifier and a power reference node.

16. The memory circuit of claim 10, wherein
each RRAM device of the array of RRAM devices comprises a selection transistor coupled in series with a resistive layer,
the drive circuit comprises a second amplifier configured to control a second current through a second transistor responsive to the first voltage, and
the selection transistor of each RRAM device of the array of RRAM devices is configured to conduct the second current through the resistive layer responsive to the activation voltage.

17. A method of performing a write operation on a resistive random-access memory (RRAM) device, the method comprising:
generating an activation voltage based on a resistance value of a resistive device;

conducting a first current in a first current path to generate a first voltage difference based on the activation voltage; and applying the activation voltage to the RRAM device, thereby generating a second voltage difference in a selection transistor, the second voltage difference having a value corresponding to a value of the first voltage difference.

18. The method of claim 17, wherein the generating the activation voltage comprises using an amplifier in a closed loop configuration to drive a gate of a transistor with the activation voltage.

19. The method of claim 18, wherein the generating the first voltage difference comprises using the transistor to generate the first voltage difference in response to the activation voltage.

20. The method of claim 17, further comprising:
including the voltage difference in a bias voltage;
generating a drive voltage from the bias voltage; and
applying the drive voltage to the RRAM device.

* * * * *